(12) United States Patent
Wang et al.

(10) Patent No.: US 11,125,512 B2
(45) Date of Patent: Sep. 21, 2021

(54) COOLANT AND A METHOD TO CONTROL THE PH AND RESISTIVITY OF COOLANT USED IN A HEAT EXCHANGER

(71) Applicant: Applied Materials, Inc., Santa Clara, CA (US)

(72) Inventors: Jianqi Wang, Fremont, CA (US); Joung Woo Lee, Singapore (SG); Gia Pham, San Jose, CA (US); Alex Gerrard, San Jose, CA (US); Robert C. McIntosh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 797 days.

(21) Appl. No.: 15/472,691

(22) Filed: Mar. 29, 2017

(65) Prior Publication Data

US 2017/0307310 A1 Oct. 26, 2017

Related U.S. Application Data

(60) Provisional application No. 62/327,228, filed on Apr. 25, 2016.

(51) Int. Cl.
*F28F 19/00* (2006.01)
*H01L 21/67* (2006.01)
(Continued)

(52) U.S. Cl.
CPC ............... *F28F 19/00* (2013.01); *C09K 5/10* (2013.01); *F28F 23/00* (2013.01);
(Continued)

(58) Field of Classification Search
CPC ..... F28F 19/00; F28F 23/00; H01L 21/67109; H01L 21/67253; H01L 21/67098; C09K 5/10
See application file for complete search history.

(56) References Cited

U.S. PATENT DOCUMENTS 4,251,332 A * 2/1981 Ginsburg ................. C25B 3/04
205/463
4,454,046 A 6/1984 Wallace et al.
(Continued)

FOREIGN PATENT DOCUMENTS

| CN | 102786916 A | * 11/2012 |
| CN | 102786916 A | 11/2012 |
| JP | 07-115154 A | 5/1995 |

OTHER PUBLICATIONS

English translation of CN-102786916-A (Year: 2019).*
(Continued)

*Primary Examiner* — Christopher R Zerphey
*Assistant Examiner* — Melodee Jefferson
(74) *Attorney, Agent, or Firm* — Patterson + Sheridan, LLP

(57) ABSTRACT

Implementations described herein generally relate to substrate processing equipment and more particularly to methods and compositions for temperature control of substrate processing equipment. In one implementation, a method of cooling a processing chamber component is provided. The method comprises introducing an inert purge gas into a supply reservoir containing a coolant and flowing the treated coolant to a processing chamber component to cool the processing chamber component. The coolant initially comprises deionized water and a water-soluble base.

6 Claims, 4 Drawing Sheets

(51) Int. Cl.
  *C09K 5/10* (2006.01)
  *F28F 23/00* (2006.01)
(52) U.S. Cl.
  CPC .. *H01L 21/67098* (2013.01); *H01L 21/67109* (2013.01); *H01L 21/67253* (2013.01)

(56) References Cited

U.S. PATENT DOCUMENTS

| | | | | |
|---|---|---|---|---|
| 5,266,532 A | * | 11/1993 | Russell | H01L 21/3065 |
| | | | | 257/E21.218 |
| 6,368,552 B1 | | 4/2002 | Shimura et al. | |
| 2002/0030177 A1 | * | 3/2002 | Turcotte | C23F 11/08 |
| | | | | 252/71 |
| 2003/0209143 A1 | * | 11/2003 | Yonebayashi | B01D 19/0005 |
| | | | | 95/241 |
| 2006/0060329 A1 | * | 3/2006 | Imura | C09K 5/10 |
| | | | | 165/104.26 |
| 2013/0219934 A1 | * | 8/2013 | Sasaki | F25D 7/00 |
| | | | | 62/121 |
| 2013/0281341 A1 | | 10/2013 | Crytzer et al. | |
| 2013/0306238 A1 | * | 11/2013 | Miura | B01F 1/0038 |
| | | | | 156/345.11 |
| 2014/0366817 A1 | * | 12/2014 | Turcotte | C23F 11/08 |
| | | | | 123/41.42 |
| 2015/0109734 A1 | * | 4/2015 | Boday | F28D 15/02 |
| | | | | 361/699 |

OTHER PUBLICATIONS

"PACS2001. Proceedings of the 2001 Particle Accelerator Conference (Cat. No. 01CH37268)," PACS2001. Proceedings of the 2001 Particle Accelerator Conference (Cat. No. 01CH37268), Chicago, IL, USA, 2001, pp. i-, doi: 10.1109/PAC.2001.986467. (Year: 2001).*

International Search Report and Written Opinion for International Application No. PCT/US2017/024822 dated Jul. 12, 2017.

Office Action for Taiwan Application No. 106113396 dated Apr. 11, 2019.

Search Report for Taiwan Application No. 106113396 dated Mar. 16, 2019.

* cited by examiner

COOLANT AND A METHOD TO CONTROL THE PH AND RESISTIVITY OF COOLANT USED IN A HEAT EXCHANGER

CROSS-REFERENCE TO RELATED APPLICATIONS

This application claims benefit of U.S. provisional patent application Ser. No. 62/327,228, filed Apr. 25, 2016. The aforementioned related patent application is herein incorporated by reference in its entirety.

BACKGROUND

Field

Implementations described herein generally relate to substrate processing equipment and more particularly to methods and compositions for temperature control of substrate processing equipment.

Description of the Related Art

Several applications that involve thermal processing of substrates such as semiconductor wafers and other materials involve the process of rapidly heating and cooling a substrate. Examples of such processing include rapid thermal processing (RTP), physical vapor deposition (PVD), dynamic surface annealing (DSA) and the like, which are used for a number of semiconductor fabrication processes. These processes are often thermally based and typically involve high process temperatures ranging from, for example, 200 degrees Celsius to 1,600 degrees Celsius, which can result in significant thermal budget issues that adversely affect device performance.

Processing chambers utilized in substrate fabrication processes typically comprise a number of components that are repeatedly heated and cooled during and after these thermally based processes are performed. Temperature control in some of these components includes active cooling through a heat exchanger. Currently, coolants (e.g., distilled water) used in the heat exchanger suffer from inconsistency in both pH and resistivity. The pH of distilled water tends to be low (acidic, due to reaction with carbon dioxide ($CO_2$) in the air) and the resistivity is difficult to control depending on the source. This inconsistency in pH sometimes leads to corrosion of the metal components of the heat exchanger. For example, as the acidity of the coolant increases the metal corrosion rate also increases. This metal corrosion can clog the flow path leading to overheating and permanent damage to the component. Other parameters such as metals (e.g., sodium, magnesium, iron and lead), anions (e.g., chlorides, nitrates/nitrites, sulfates, silicates) and bacteria can also accelerate metal corrosion.

In order to prevent components from early failure due to metal corrosion, there is a need for coolants and methods of temperature control that are not only able to meet specifications for pH and resistivity as well as other properties, but also maintain these specifications in the optimal range consistently.

SUMMARY

Implementations described herein generally relate to substrate processing equipment and more particularly to methods and compositions for temperature control of substrate processing equipment. In one implementation, a method of cooling a processing chamber component is provided. The method comprises introducing an inert purge gas into a supply reservoir containing a coolant to form a treated coolant. The coolant initially comprises deionized water and a water-soluble base. The method further comprises flowing the treated coolant to a processing chamber component to cool the processing chamber component.

In another implementation, a method of cooling a processing chamber component is provided. The method comprises introducing a nitrogen purge gas into a supply reservoir containing a coolant to remove $CO_2$ from a space above the liquid coolant in the supply reservoir. The coolant initially comprises deionized water and sodium hydroxide. The method further comprises flowing the nitrogen-treated coolant to an energy source to cool the energy source.

In yet another implementation, a method of cooling a processing chamber component is provided. The method comprises introducing a nitrogen purge gas into a supply reservoir containing a coolant to remove $CO_2$ from a space above the liquid coolant in the supply reservoir. The coolant initially comprises deionized water and sodium hydroxide. The method further comprises flowing the nitrogen-treated coolant to an energy source to cool the energy source, wherein flowing the nitrogen-treated coolant to the energy source to cool the energy source includes flowing the nitrogen-treated coolant through a channel having an exposed copper surface.

In yet another implementation, a method of cooling a processing chamber component is provided. The method includes making the liquid coolant slightly basic (e.g., pH~9) initially, filling a supply reservoir of a heat exchanger assembly with the needed amount of liquid coolant, and purging the $CO_2$ from the air headspace above the liquid coolant in the supply reservoir with nitrogen purge gas.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
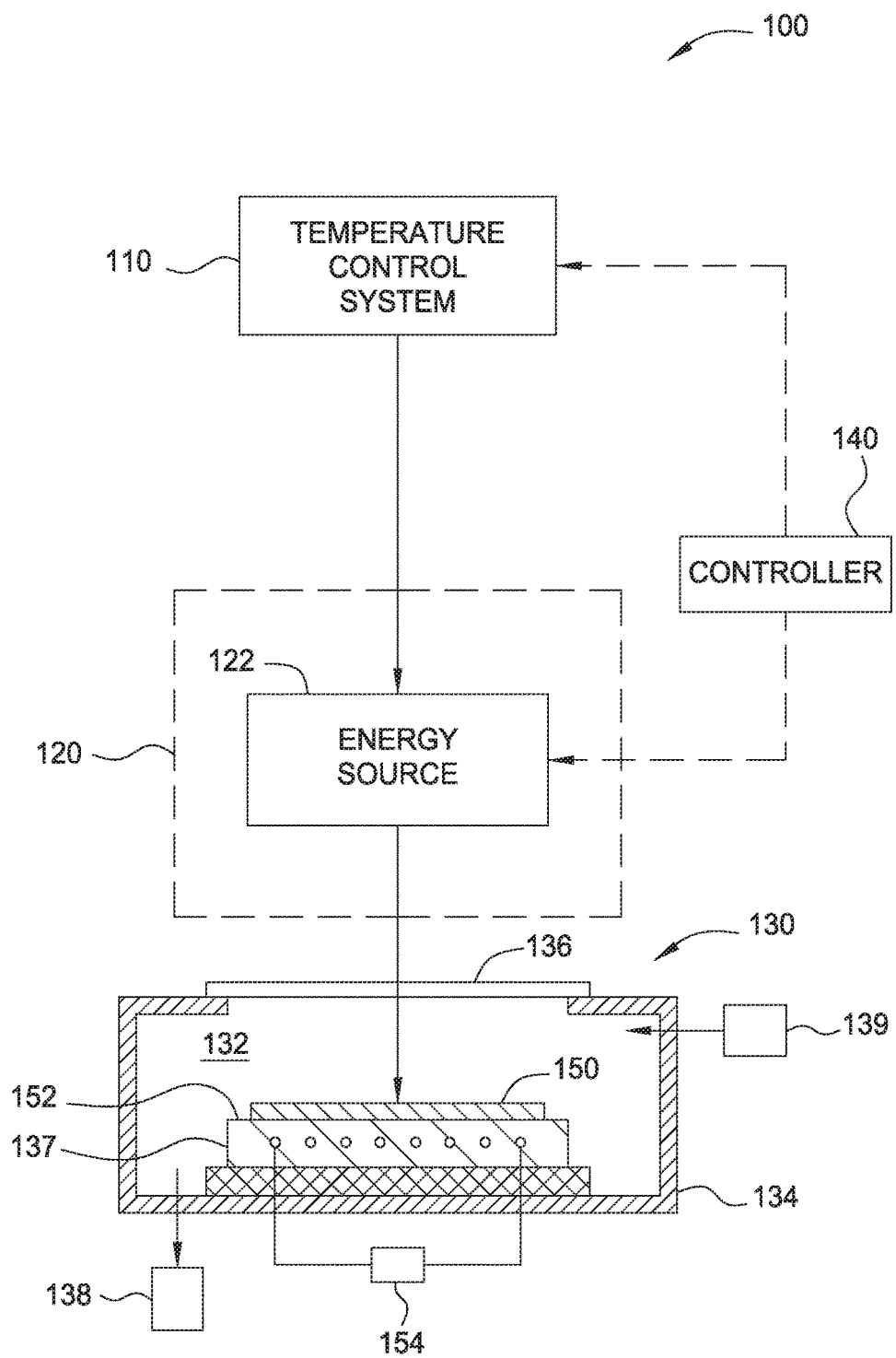
FIG. 1 illustrates a schematic view of a laser anneal system having a temperature control system according to one implementation of the present disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes methods and compositions for temperature control of substrate processing equipment. Certain details are set forth in the following description and in FIGS. 1 to 4 to provide a thorough understanding of various implementations of the disclosure. Other details describing well-known structures and systems often associated with temperature control and thermal processing are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a dynamic surface annealing process that can be carried out using a laser-based annealing tool, such as a VANTAGE® ASTRA™ DSA system available from Applied Materials, Inc. of Santa Clara, Calif. Other tools capable of performing thermal processes may also be adapted to benefit from the implementations described herein. In addition, any system enabling temperature control processes described herein can be used to advantage. The apparatus description described herein is illustrative and should not be construed or interpreted as limiting the scope of the implementations described herein. Although discussed in relation to a semiconductor processing apparatus, it should be understood that the implementations described herein are also applicable to heat exchangers, chillers or boilers in any industry where temperature control is desirable.

Dynamic Surface Anneal ("DSA") laser sources typically include active cooling through a heat exchanger (HX). Current coolant (distilled water) used in the heat exchanger suffers from inconsistency in pH and resistivity. The pH of distilled water tends to be low (acidic, due to reaction with carbon dioxide ($CO_2$) in the air) and the resistivity is difficult to control depending on the source. The pH of the coolant is one of the main parameters affecting metal (e.g., copper) corrosion in the coolant channel. The copper corrosion rate increases with increasing acidity (lower pH) of coolant. Copper component corrosion in the coolant channel can clog the flow path leading to laser overheat and permanent damage. Other parameters such as metals (e.g., sodium, magnesium, iron and lead), anions (e.g., chlorides, nitrates/nitrites, sulfates, and silicates) and bacteria present in the coolant can also accelerate metal corrosion.

In order to prevent DSA light sources from early failure due to copper corrosion, it is desirable to develop a new coolant that is not only able to meet specifications for pH and resistivity as well as other properties, but also consistently maintain these parameters in the optimal range consistently. In some implementations of the present disclosure, a new coolant that meets the criteria disclosed in Table 1 is provided. Table 1 depicts the permissible coolant levels for microbiological (colony forming unit/milliliter, inorganic chemicals, and other parameters in comparison with the amounts of microbiological and inorganic chemicals present in some implementations of the coolant described herein. In some implementations of the present disclosure, a novel method of maintaining the pH and resistivity of a coolant within a desired temperature range is provided.

TABLE 1

Coolant Water Quality Specifications

|  | Permissible (cfu/ml) | New Coolant (cfu/ml) |
| --- | --- | --- |
| Microbiologicals | <500 | 25 |

|  | Permissible (ppm) | (ppm) |
| --- | --- | --- |
| Inorganic Chemicals | | |
| Calcium | <25 | <0.6 |
| Chloride | <25 | <10 |
| Copper | <1.3 | <1 |
| | <0.020 ppm if fluid contact with Aluminum | |
| Iron | <0.3 | <0.1 |
| Lead | <0.015 | 0 |
| Magnesium | <12 | <0.1 |
| Manganese | <0.05 | <0.03 |
| Nitrates/Nitrites | <10 as N | 0/0 |
| Potassium | <20 | <0.3 |
| Silicate | <25 | <1.0 |
| Sodium | <20 | <0.3 |
| Sulfate | <25 | <1 |
| Hardness (CaCO3) | <17 | ND |
| Total Dissolved Solids | <50 | 17 |
| Other Parameters | | |
| pH | 6.5-8.5 | 8.41 |
| Resistivity | 250-500 kΩ · cm | 500 kΩ · cm |

In one implementation described herein, a new coolant is formed by adding an amount of a water-soluble base (e.g., sodium hydroxide) to deionized water to achieve a desired pH value (e.g., equal to or greater than 6.5, equal to or greater than about 8; between about 6.5 and 8.5; between about 8 and about 10; between about 8.5 and 9; between about 9 and about 10; or about 9.1) and a conductivity (e.g., greater than about 2 μs/cm; between about 2 and about 4 μs/cm; between about 2 and about 3 μs/cm; or about 3.3 μs/cm). However, during a period of storage in a plastic bottle with cap closed, the pH and conductivity drifted lower with time. For example, in one experiment, the pH and conductivity of the newly made coolant were initially measured to be 9.1 and 3.3, respectively, on the first day of formulation, but 10 days later, the values slowly dropped to 6.7 and 1.9, respectively, for pH and conductivity.

Not to be bound by theory, but it is believed that the drifting of pH and conductivity is due to the reaction of $CO_2$ present in the air with hydroxide ions ($OH^-$) present in the coolant (e.g., $CO_2 + OH^- \leftrightarrows HCO_3^-$). The reaction consumes the hydroxide base ($OH^-$—high conductivity) to produce less basic bicarbonate ($HCO_3^-$—lower conductivity), hence the lower drifting trend for both pH and conductivity. The inventors observed significant variations in pH while filling the heat exchanger with a pre-formulated coolant. For example, in one experiment as shown in Table 2, a newly formulated coolant according to implementations described herein with a measured pH of 9.1 was added to a heat exchanger. Immediately after filling the heat exchanger, the pH of the coolant dropped to 6.9. It is believed that the pH and conductivity dropped quickly because the heat exchanger was running recirculation, which accelerated the reaction of $OH^-$ with $CO_2$ from air.

TABLE 2

HX Coolant Monitoring with PH 9.1 & σ 3.1

| Day | Condition/Duration | HH:MM | PH | Σ |
|---|---|---|---|---|
| 1 | Coolant Baseline with HX off | | 6.1 | 2.35 |
| 1 | New Coolant | 10:00 | 9.07 | 3.1 |
| | Just after fill | 14:00 | 6.9 | 3.6 |
| | 2 HR | 16:00 | 7.13 | 2.07 |
| | 1.5 HR | 17:30 | 6.74 | 1.87 |
| | 2 HR | 19:30 | 6.69 | 2.06 |
| 2 | 12 HR | 9:50 | 6.46 | 1.87 |
| | 1.5 HR W N2 Purge | 1:30 | 6.97 | 1.97 |

With reference to Table 2, the newly made water coolant had an initial pH of 9.07 and an initial conductivity of 3.1 μS/cm. Just after filling the supply reservoir of the heat exchanger, the pH dropped to 6.9 and the conductivity increased to 3.6 μS/cm. About 20 hours after filling, the pH dropped to 6.5 and the conductivity dropped to 1.87 μS/cm. After and 1.5 hour $N_2$ purge as described herein, the pH increased to 6.97 from 6.46. Not to be bound by theory, but it is believed that $CO_2$ in the air reacts with $OH^-$ in water to reduce the pH (more acidic) and the ion product $HCO_3^-$ migrates much slower than $OH^-$ so conductivity is also lower.

In another experiment (Table 3), the inventors found that purging the heat exchanger with nitrogen gas ($N_2$) increases the pH of the coolant while maintaining the conductivity of the coolant. However, upon stopping the nitrogen purge, the pH of the coolant dropped. Not to be bound by theory but it is believed that purging the fluid supply reservoir containing the coolant with $N_2$ prevent additional $CO_2$ from entering the coolant system while removing dissolved $CO_2$ from the coolant.

TABLE 3

| Day | Condition & Duration | HH:MM | PH | σ (μs/cm) |
|---|---|---|---|---|
| Day 1 (8 Feb) | 2 ml NaOH (0.015%)/Gallon (DI) | | | |
| | 30 min | 20:00 | 6.78 | 2 |
| | 1 Hr | 21:00 | 6.7 | 1.79 |
| | 1 Hr | 22:00 | 6.69 | 1.89 |
| | 2 Hr | 0:00 | 6.6 | 2.07 |
| Day 2 (9 Feb) | 9 Hr N2 P (~10 Psi) | 9:30 | 7.36 | 1.89 |
| | 1.5 Hr N2 P | 11:00 | 7.48 | 1.77 |
| | Add high concentration | 11:30 | 8.62 | 2.48 |
| | 1 Hr N2 P | 12:30 | 8.41 | 2.36 |
| | 2 Hr N2 P | 14:30 | 8.47 | 2.42 |
| | 5 Hr N2 P | 19:30 | 8.54 | 2.53 |
| Day 3 (10 Feb) | 13.5 Hr N2 P | 9:00 | 8.33 | 2.37 |
| | 1.5 Hr N2 P | 11:30 | 8.41 | 2.49 |
| | 2 Hr (>20 Psi) N2 P | 14:00 | 8.23 | 2.4 |
| | 5 Hr (>20 Psi) N2 P | 19:00 | 8.42 | 2.54 |
| Day 4 (11 Feb) | 13 Hr (~5 Psi) N2 P | 8:30 | 8.26 | 2.35 |
| | 2.5 Hr Stop N2 P | 11:00 | 7.6 | 2.35 |
| | 1 Hr No N2 P | 12:00 | 7.35 | 2.5 |
| | 2 Hr No N2 P No Tape | 14:00 | 7.15 | 2.28 |
| | 2 Hr w N2 P (~7 Psi) | 16:00 | 7.31 | 2.26 |
| | After install laser | 17:20 | 7.25 | 2.33 |
| | Add water & laser on | 17:40 | 7.1 | 2.27 |
| | 2 Hr N2 P (~10 L) | 19:40 | 7.38 | 2.35 |
| Day 5 (12 Feb) | 12 Hr N2 P (~10 L) | 8:00 | 8.15 | 2.57 |
| | New water 3.2 ml 7 Gallon | 15:40 | 8.57 | 3 |

In another experiment (Table 4), the inventors conducted a six-day long purging test. The inventors successfully maintained the pH and conductivity within a desired specification range by purging the fluid reservoir containing the new coolant with $N_2$ at a flow rate between 0.8 Liters/minute and 20 Liters/minute. In some implementations, 0.8 Liters/minute is the lowest $N_2$ flow rate for maintaining a stable pH and conductivity. Above an $N_2$ flow rate of 0.8 Liters/minute, the pH and conductivity did not seem to change with the increased $N_2$ flow rate. Hence, lower $N_2$ flow is preferred for cost saving purpose.

TABLE 4

| Day | Condition & Duration | HH:MM | N2 Purge | pH | σ (μs/cm) | Resistivity (MΩcm) |
|---|---|---|---|---|---|---|
| Target Spec | | | | 8.5 | 2-4 | 0.25-0.5 |
| New Water | 3.2 ml NaOH(0.015%)/Gallon(DI) | 17:20 | | 9.32 | 5.2 | 0.19 |
| Day 5 (February 12) | 5 Min after turn on HX | 17:40 | | 8.57 | 3 | 0.33 |
| | 1 Hr | 18:40 | 2.5 | 8.28 | 2.71 | 0.37 |
| | 2 Hr | 20:40 | 5.0 | 8.4 | 2.61 | 0.38 |
| Day 6 (February 13) | 13 Hr | 9:40 | 5.0 | 8.36 | 2.75 | 0.36 |
| | 3 Hr | 12:40 | 5.0 | 8.45 | 2.73 | 0.37 |
| | 1 Hr | 13:40 | 3.0 | 8.39 | 2.72 | 0.37 |
| | 8 Hr | 22:00 | 3.0 | 8.4 | 2.75 | 0.36 |
| Day 7 (February 14) | 8 Hr with Tape | 6:00 | 3.0 | 8.38 | 2.72 | 0.37 |
| | 8 Hr with Tape | 14:00 | 20.0 | 8.4 | 2.78 | 0.36 |
| | 1 Hr/Add~3 L(PH9.28 σ 3.46) | 15:00 | 3.0 | 8.49 | 2.85 | 0.35 |
| | 1 Hr | 16:00 | 3.0 | 8.55 | 2.88 | 0.35 |
| | 6 Hr | 20:00 | 3.0 | 8.62 | 2.83 | 0.35 |
| | 2 Hr | 22:00 | 1.6 | 8.5 | 2.71 | 0.37 |
| Day 8 (February 15) | 8 Hr | 6:00 | 1.6 | 8.48 | 2.66 | 0.38 |
| | 1 Hr | 7:30 | 0.8 | 8.37 | 2.55 | 0.39 |
| | 5 Hr | 12:30 | 0.8 | 8.35 | 2.48 | 0.40 |
| | 8 Hr | 20:30 | 0.8 | 8.33 | 2.62 | 0.38 |
| | 2 Hr No tape | 10:30 | 0.8 | 7.8 | 2.55 | 0.39 |
| Day 9 (February 16) | 8 Hr No tape | 6:30 | 0.8 | 7.8 | 2.53 | 0.40 |
| | 3 Hr No tape | 9:30 | 0.8 | 7.85 | 2.63 | 0.38 |
| | 5 Hr No tape | 10:20 | 1.6 | 7.9 | 2.59 | 0.39 |
| Day 10 (February 17) | 5 Hr No tape | 9:20 | 1.6 | 8.3 | 2.73 | 0.37 |
| | 30 min/Add~3.5 L(PH9.00 σ 3.64) | 10:30 | 1.6 | 8.46 | 2.6 | 0.38 |
| | 30.5 Hr | 16:00 | 1.6 | 8.16 | 2.74 | 0.36 |
| | 1 Hr/Add~3.5 L(PH9.20 σ 4.58) | 17:00 | 1.6 | 8.1 | 2.79 | 0.36 |

In certain implementations, a liquid coolant for temperature control is provided. The liquid coolant includes purified water (e.g., demineralized water, deionized water, or mixtures thereof) and has a pH of 8.0 or higher. The pH is established in the presence of one pH control agent. The pH control agent can be selected from those known in the art. In one implementation, the pH control agent is a basic compound (e.g., sodium hydroxide). In one implementation, the pH control agent is ammonia-free and/or nitrogen-free. It is preferable to avoid ammonia-based and nitrogen-based pH control agents because it has been found by the inventors that these types of pH control agents increase the presence of undesirable bacteria in the liquid coolant. The pH control agent or blend of pH control agents is present in an amount sufficient to achieve a pH within a range of from about 8.0 to about 12.5, or from about 9.0 to about 10.5, or from about 9.8 to about 10.5.

Table 5 depicts theoretical calculations for a liquid coolant according to the implementations disclosed herein.

TABLE 5

| pH of Coolant | Coolant | [OH−], mol/L | [H+], mol/L | [Na+], mol/L | [Na+], ppm | Molar Conductivity ($10^{-4} m^2$ $mol^{-1} \Omega^{-1}$) | Conductivity, $\Omega^{-1} m^{-1}$ | Conductivity, μs/cm | Resistivity, MΩcm |
|---|---|---|---|---|---|---|---|---|---|
| 7 | Pure Water | 1.00E−07 | 1.00E−07 | 0.00E+00 | 0.00 | 547.65 | 5.48E−06 | 0.0548 | 18.26 |
| 8.5 | 3.16 μm, NaOH | 3.16E−06 | 3.16E−09 | 3.16E−06 | 0.07 | 248.08 | 7.84E−05 | 0.784 | 1.27 |
| 9 | 10 μm, NaOH | 1.00E−05 | 1.00E−09 | 1.00E−05 | 0.23 | 248.08 | 2.48E−04 | 2.48 | 0.40 |

Table 6 depicts one exemplary recipe for a coolant formed according to the implementations described herein.

TABLE 6

Coolant Recipe Calculation

| Total Volume of Coolant needed (Gallon) | pH of Coolant | NaOH needed (gram) | Pure DIW needed (Liter) |
|---|---|---|---|
| 12 | 8.5 | 0.00575 | 45.42 |

In yet another implementation, a method of cooling a processing chamber component is provided. The method includes making the liquid coolant slightly basic (e.g., pH~9) initially, filling a supply reservoir of a heat exchanger assembly with the needed amount of liquid coolant, and purging the $CO_2$ from the air headspace above the liquid coolant in the supply reservoir with nitrogen purge gas. The purge tube for delivering the nitrogen purge gas to the air headspace is typically positioned to prevent bubbles from forming in the liquid coolant (e.g., the purge tube is not inserted into the liquid coolant.) As $CO_2$ is purged from the air headspace above the liquid coolant, the equilibrium (e.g., $CO_2 + H_2O \leftrightarrows H_2CO_3$) shifts to the left and dissolved $CO_2$ is removed from the coolant until a new equilibrium is reached so the pH is maintained stable by the nitrogen purge.

FIG. 1 illustrates a schematic view of a laser annealing system 100 having a temperature control system 110 according to one implementation of the present disclosure. The laser annealing system 100 contains the temperature control system 110, an optical system 120, a laser anneal processing chamber 130, and a system controller 140. The system controller 140 is generally adapted to control the various components contained within the temperature control system 110, the optical system 120 and the laser anneal processing chamber 130, which are discussed herein. The system controller 140 is generally designed to facilitate the control and automation of the thermal processing techniques and the temperature control system described herein.

The system controller 140 typically contains a central processing unit (CPU) (not shown), memory (not shown), and support circuits (or I/O) (not shown). The CPU may be one of any form of computer processors that are used in industrial settings for controlling various processes and hardware (e.g., conventional electromagnetic radiation detectors, motors, laser hardware, heat exchanger) and monitor the processes (e.g., substrate temperature, substrate support temperature, amount of energy from the pulsed laser, detector's signal, laser hardware temperature). The memory (not shown) is connected to the CPU, and may be one or more readily available memory, such as random access memory (RAM), read only memory (ROM), floppy disk, hard disk, or any other form of digital storage, remote or local. Software instructions and data can be coded and stored within the memory for instructing the CPU. The support circuits (not shown) are also connected to the CPU for supporting the processor in a conventional manner. The support circuits may include conventional cache, power supplies, clock circuits, input/output circuitry, subsystems and the like.

The laser anneal processing chamber 130 contains an enclosed processing region 132 that has one or more chamber walls 134 and an optically transparent window 136. The laser anneal processing chamber 130 may also contain a substrate support 137. During processing, the enclosed processing region 132 may be evacuated by use of a vacuum pump 138 and/or purged using an inert gas source 139 to reduce the partial pressure of undesirable gases, such as oxygen. The inert gas source may be any inert gas compatible with the chemistry of the coolant. Exemplary inert gases include nitrogen, argon, helium and combinations thereof.

The optical system 120 includes an energy source 122. The optical system 120 may further comprise additional components including a dose control system, a pulse stretcher assembly, a beam homogenizer assembly, and a relay optics system. The optical system 120 is adapted to repeatedly deliver a desired uniform dose of energy across anneal regions on a substrate 150 positioned on the substrate support 137 to preferentially anneal and/or melt desired areas within these regions. The temperature of the substrate 150 may be controlled by positioning the substrate 150 in thermal contact with a substrate support surface 152 of the substrate support 137 and a heat-exchanging device 154. The heat exchanging device 154 is generally adapted to heat and/or cool the substrate support 137 prior to, during, or after the annealing process. In this configuration, the heat exchanging device 154, such as a conventional substrate heater available from Applied Materials, Inc., Santa Clara, Calif. (e.g., electrically resistive heating elements, temperature controlled fluid heat exchanger), and may be used to improve the post-processing properties of the annealing regions of the substrate.

The system controller 140 and components within the optical system 120 are used to control the timing, the duration, the profile of the pulse (e.g., energy verses time), and amount of energy delivered in each pulse to the anneal region. The system controller 140 is also generally adapted to control the laser anneal processing chamber 130 and other system components discussed herein including the temperature control system 110.

The amount of energy needed to perform the laser anneal process on a semiconductor substrate can be quite large. For example, the dose of energy delivered from the energy source 122 can be quite large. For example, the dose of energy delivered from the energy source 122 may be between about 1 and about 10 Joules over an 8 to 10 nanosecond (ns) pulse duration, which is equivalent to delivering an average total power of between about 100 MW to about 1,250 MW in each pulse to the anneal region. If the anneal regions have an area of between about 4 mm$^2$ and about 1,000 mm$^2$ the average energy density will be between about 0.1 MW/mm$^2$ and about 313 MW/mm$^2$. It has been found that the high power needed to perform the pulse laser anneal process can cause the usable lifetime of the optical components used to deliver or direct the energy to the surface of the substrate to be significantly reduced due to damage. The induced damage can cause the process uniformity to vary pulse-to-pulse and increase the cost-of-ownership of the system.

The energy source 122 is generally adapted to deliver electromagnetic energy that is used to perform the pulse laser anneal process. Typical sources of electromagnetic radiation include, but are not limited to an optical radiation source, an electron beam source, and/or a microwave energy source. In one implementation, the energy source 122 is a laser adapted to deliver optical radiation to selectively heat desired regions of a substrate to their melting point. In one implementation, the energy source 122 is adapted to deliver energy at a wavelength less than about 1064 nm to a primarily silicon containing substrate. In one implementation, the laser annealing process is performed on a silicon containing substrate using radiation that is delivered at wavelengths that are less than 800 nm. In another implementation, the wavelength of the electromagnetic energy delivered from the energy source 122 is about 532 nanometers to the primarily silicon containing substrate. In yet another implementation, the wavelength of the electromagnetic energy delivered from the energy source 122 is about 216 nm or about 193 nm to the primarily silicon containing substrate. In one implementation of the present disclosure, it is desirable to use an Nd:YAG (neodymium-doped yttrium aluminum garnet) laser that is adapted to deliver energy at a wavelength between about 266 nm and about 1064 nm.

In one implementation, the energy source 122 is adapted to deliver energy between about 1 and 10 joules at a pulse width between about 6 ns and about 80 ns at a desired wavelength, such as 532 nm. In another implementation, the energy source 122 is adapted to deliver energy between about 1 and 10 joules at a pulse width between about 20 ns and about 30 ns at a desired wavelength, such as 532 nm. In another implementation, the energy source 122 is adapted to deliver energy between about 1 and 10 joules at a pulse width between about 8 ns and about 80 ns at wavelengths such as 748 nm and/or 1064 nm.

Figure 2:
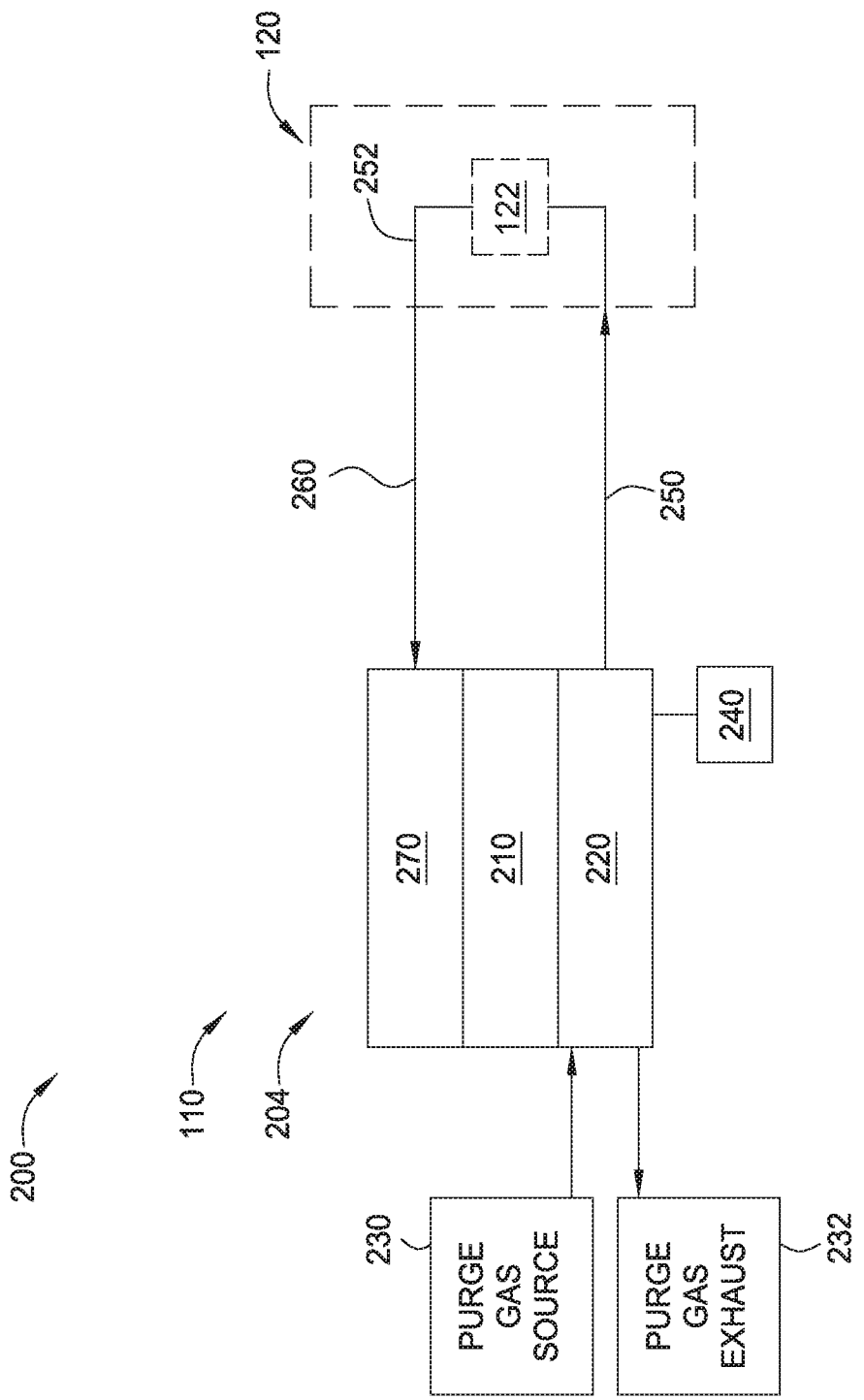
FIG. 2 illustrates a schematic view of a cooling loop according to one implementation of the present disclosure.

FIG. 2 illustrates a schematic view of a cooling loop 200 according to one implementation of the present disclosure. The cooling loop 200 includes the temperature control system 110 and the optical system 120. As depicted in FIG. 1, the optical system includes the energy source 122. The temperature control system 110 includes a heat exchanger assembly 204 for cooling the cooling liquid. The heat exchanger assembly 204 includes a cooling fluid supply, such as a supply reservoir 220 or other (typically positive pressure) source of fluid. The supply reservoir 220 can receive a flow of a purge gas (e.g., an inert gas) from a purge gas source 230 during the cooling and recirculation process. The purge gas source 230 is typically positioned to deliver the purge gas to the space above the liquid coolant in the supply reservoir 220. The purge gas can be removed from the supply reservoir 220 via a purge gas exhaust 232. The supply reservoir 220 can also have at least one gas sensor, such as an oxygen sensor 240, for monitoring the oxygen levels in the recirculating fluid. The cooling liquid can be directed through delivery lines 250 from the supply reservoir 220 to a coolant channel 252, which traverses the energy source 122 to remove heat from the energy source 122. The coolant channel may be a microchannel having a hydraulic diameter below 1 millimeter (e.g., ½ millimeter or below). The coolant channel 252 may have a metallic surface (e.g., copper) that is exposed. The heated cooling liquid can be directed from the coolant channel 252 through recirculating lines 260 into a return reservoir 270. The heated cooling liquid may be directed through a heat exchanger 210 to remove heat from the heated cooling liquid prior to returning the coolant to the supply reservoir 220. It should be understood that the temperature control system 110 depicted in FIG. 2 is only exemplary and that other heat exchange systems may be used. For example, in some implementations, the temperature control system has one reservoir which serves the function of the both the supply and return reservoirs.

Figure 3:
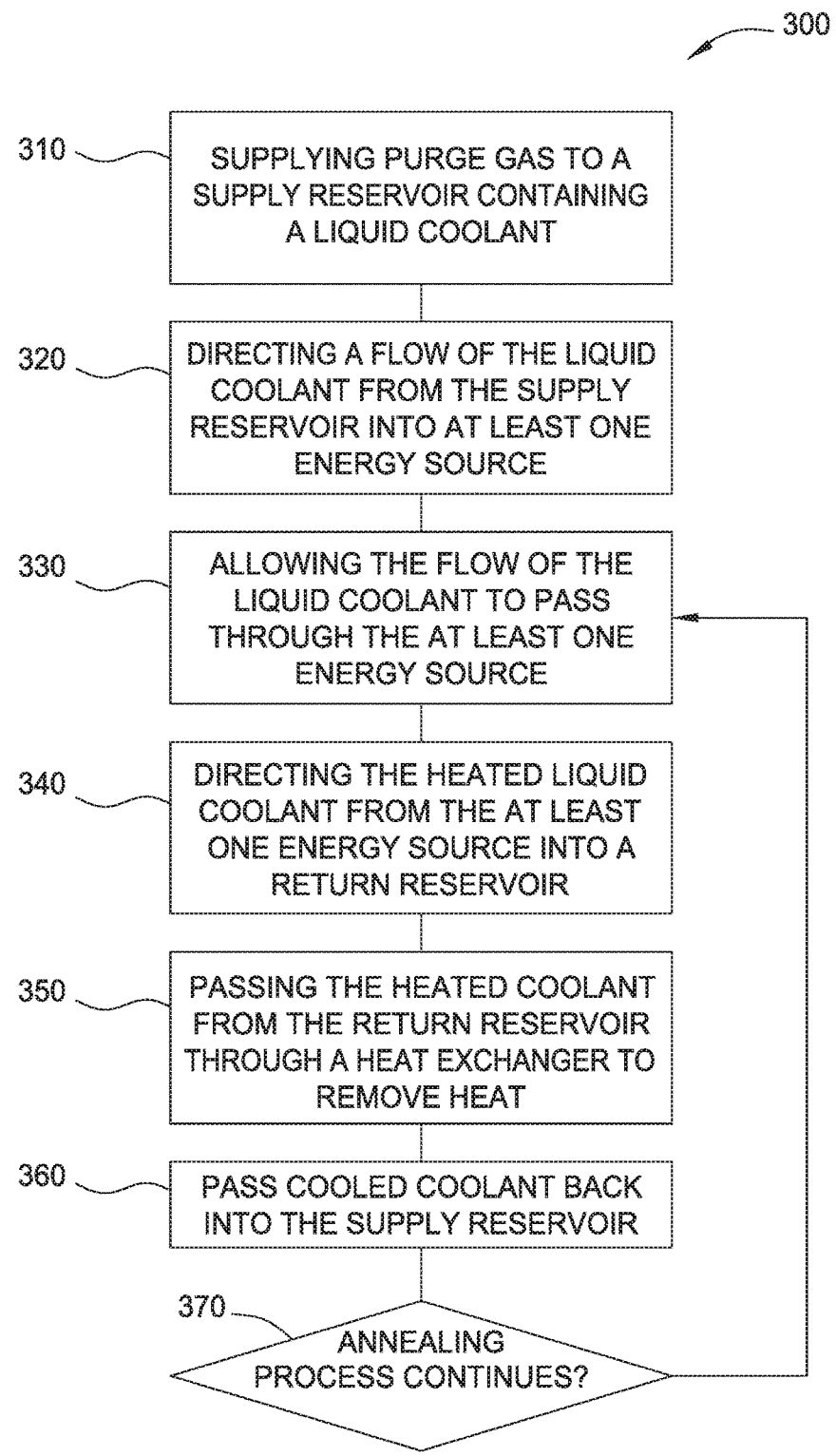
FIG. 3 illustrates a flow diagram for temperature control according to one implementation of the present disclosure.

FIG. 3 illustrates a flow diagram for a method 300 of temperature control for cooling an annealing system in accordance with one implementation of the present disclosure. The method 300 may be practiced on a laser annealing system, for example, the laser annealing system 100. In the method, at operation 310, a source of purge gas is supplied to a supply reservoir containing a liquid coolant. The liquid coolant may be the same liquid coolant as described herein. As discussed herein, the purge gas can be pure nitrogen or nitrogen-enriched gas, for example, and can be generated by an appropriate device such as a component-separating membrane device. The purge gas is supplied to the space in the supply reservoir above the liquid coolant (i.e., the purge gas is not bubbled into the liquid coolant). For example, in one implementation, purge gas is supplied from purge gas source 230 to supply reservoir 220, which contains a liquid coolant according to implementations described herein.

At operation 320, a flow of the liquid coolant is directed from the supply reservoir into the at least one energy source. The at least one energy source can be the energy source of a laser annealing system. For example, in one implementation, a flow of the liquid coolant is directed from the supply reservoir 220 into the energy source 122. At operation 330, the flow of the liquid coolant passes through the at least one energy source, thus removing heat from the at least one energy source. For example, in one implementation, the flow of the liquid coolant passes through the energy source 122, thus removing heat from the energy source 122. At operation 340, the heated coolant is directed from the at least one heating source into a return reservoir. For example, in one implementation, the heated coolant passes through the energy source 122 into the return reservoir 270. At operation 350, the heated coolant is passed from the return reservoir through a heat exchanger where heat is removed from the coolant and the coolant is passed back into the supply reservoir at operation 360. For example, in one implementation, the heated coolant is passed from the return reservoir 270 through the heat exchanger 210 where heat is removed from the coolant and the coolant is passed back into the supply reservoir 220. At operation 270, if the annealing process continues, then the coolant is again directed through the at least one heating source. Otherwise, the circulation process ends. In one implementation, the supplying of purge gas to the supply reservoir is continuous throughout the process of method 300. In one implementation, the supplying of purge gas is performed for only a portion of the method 300. For example, nitrogen gas is supplied to the space above the coolant in the supply reservoir for a time-period long enough to purge gases from the space above the coolant. In one implementation, the purge gas is pulsed into the supply reservoir throughout the method 300.

Figure 4:
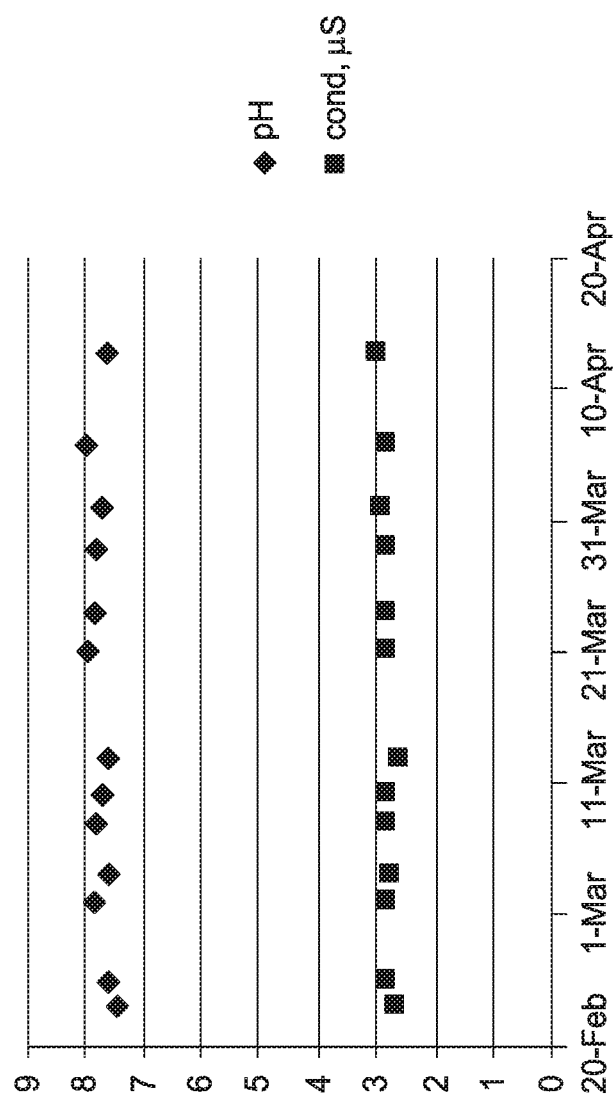
FIG. 4 illustrates a plot depicting the pH and conductivity of a coolant over a period of two months according to the implementations described herein.

FIG. 4 illustrates a plot 400 depicting the pH and conductivity of a coolant over a period of two months according to the implementations described herein. As depicted in plot 400 both the pH and conductivity are maintained within a target range for the two-month period using the implementations described herein.

Although implementations of the present disclosure are generally described herein with reference to a laser annealing system, it is contemplated that other temperature control systems (e.g., heat exchangers, chillers or boilers in any industry) may also benefit from implementations of the present disclosure.

In summary, some of the benefits of the present disclosure include maintaining the pH and conductivity of a coolant liquid within a desired range during a cooling process while reducing corrosion in metallic channels that the coolant flow through. Further, the methods of the present disclosure may be performed with minor modifications to current coolant systems (e.g., addition of a purge gas source and purge gas exhaust to the coolant supply reservoir). In addition, the methods of the present disclosure may be performed with a minor amount of purge gas (e.g., nitrogen gas), which reduces the overall cost of ownership.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the present disclosure may be devised without departing from the basic scope thereof, and the scope thereof is determined by the claims that follow.

The invention claimed is:

1. A method of cooling a processing chamber component, comprising:
   continuously introducing a nitrogen purge gas into a supply reservoir containing a coolant to remove $CO_2$ from a space above the coolant in the supply reservoir, so as to form a nitrogen-treated coolant and maintain a pH of the nitrogen-treated coolant between 8.0 and 12.5, wherein the coolant initially comprises:
   deionized water; and
   sodium hydroxide; and
   flowing the nitrogen-treated coolant to an energy source to cool the energy source.

2. The method of claim 1, wherein the nitrogen purge gas is flowed into the supply reservoir at a flow rate greater than or equal to 0.8 Liters/minute.

3. The method of claim 1, wherein the nitrogen purge gas is flowed into the supply reservoir at a flow rate between 0.8 Liters/minute and 20 Liters/minute.

4. A method of cooling a processing chamber component, comprising:
   continuously introducing a nitrogen purge gas into a supply reservoir containing a coolant to remove $CO_2$ from a space above the coolant in the supply reservoir, so as to form a nitrogen-treated coolant and maintain a pH of the nitrogen-treated coolant between 8.0 and 12.5, wherein the coolant initially comprises:
   deionized water; and
   sodium hydroxide; and
   flowing the nitrogen-treated coolant to an energy source to cool the energy source, wherein flowing the nitrogen-treated coolant to the energy source to cool the energy source includes flowing the nitrogen-treated coolant through a channel having an exposed copper surface.

5. The method of claim 1, further comprising:
   removing heat from the energy source to form a heated coolant;
   passing the heated coolant through a heat exchanger to remove heat; and
   returning the coolant to the supply reservoir.

6. The method of claim 4, further comprising:
   removing heat from the energy source to form a heated coolant;
   passing the heated coolant through a heat exchanger to remove heat; and
   returning the coolant to the supply reservoir.

* * * * *